United States Patent [19]

Elms

[11] Patent Number: 5,384,782
[45] Date of Patent: Jan. 24, 1995

[54] DIGITAL RADIO RECEIVER WITH DECODING OF CONFIDENCE LEVEL INFORMATION SUBSTITUTED FOR INTERLEAVED DATA

[75] Inventor: Andrew Elms, Reading, England

[73] Assignee: Technophone Limited, Camberly, United Kingdom

[21] Appl. No.: 952,923

[22] Filed: Sep. 28, 1992

[30] Foreign Application Priority Data

Oct. 4, 1991 [GB] United Kingdom ............. 9121140

[51] Int. Cl.[6] .............. H03M 13/00; H03M 13/22; H04B 7/26; H04Q 7/04
[52] U.S. Cl. .................. 371/2.1; 370/110.1; 371/39.1; 371/45
[58] Field of Search .......... 371/2.1, 30, 37.1, 38.1, 371/39.1, 43, 44, 45; 370/110.1, 110.4, 111

[56] References Cited

U.S. PATENT DOCUMENTS 5,042,033  8/1991  Costa ........................ 371/2.1
5,182,753  1/1993  Dahlin et al. ............... 371/43

FOREIGN PATENT DOCUMENTS 0156440 10/1985 European Pat. Off. .
0340139 11/1989 European Pat. Off. .

Primary Examiner—Stephen M. Baker
Attorney, Agent, or Firm—Perman & Green

[57] ABSTRACT

A method of receiving digitized data encoded to permit forward error correction, for example convolutionally encoded data transmitted in a burst-mode radio communication system such as GSM. Prior to transmission a set of first data elements (bits) relating to a first message which may be associated with a first channel type (e.g. a traffic channel (TCH) in GSM) has selected bits substituted or stolen by data elements (bits) relating to a second message which may be associated with a second channel type (e.g. a fast associated channel (FACCH) in GSM). At the receiver the second message is recovered by extracting the substitute data elements. In order to improve bit error rate performance the received data is then modified by replacing the substitute data elements with low-or zero-valued "soft decisions", i.e. further data elements comprising respective components indicative of the low level of confidence associated therewith relative to the original data element. The modified data is decoded using, for example a Viterbi decoder (4) sensitive to the soft decisions to estimate the most likely set of data elements comprising the first message.

18 Claims, 3 Drawing Sheets

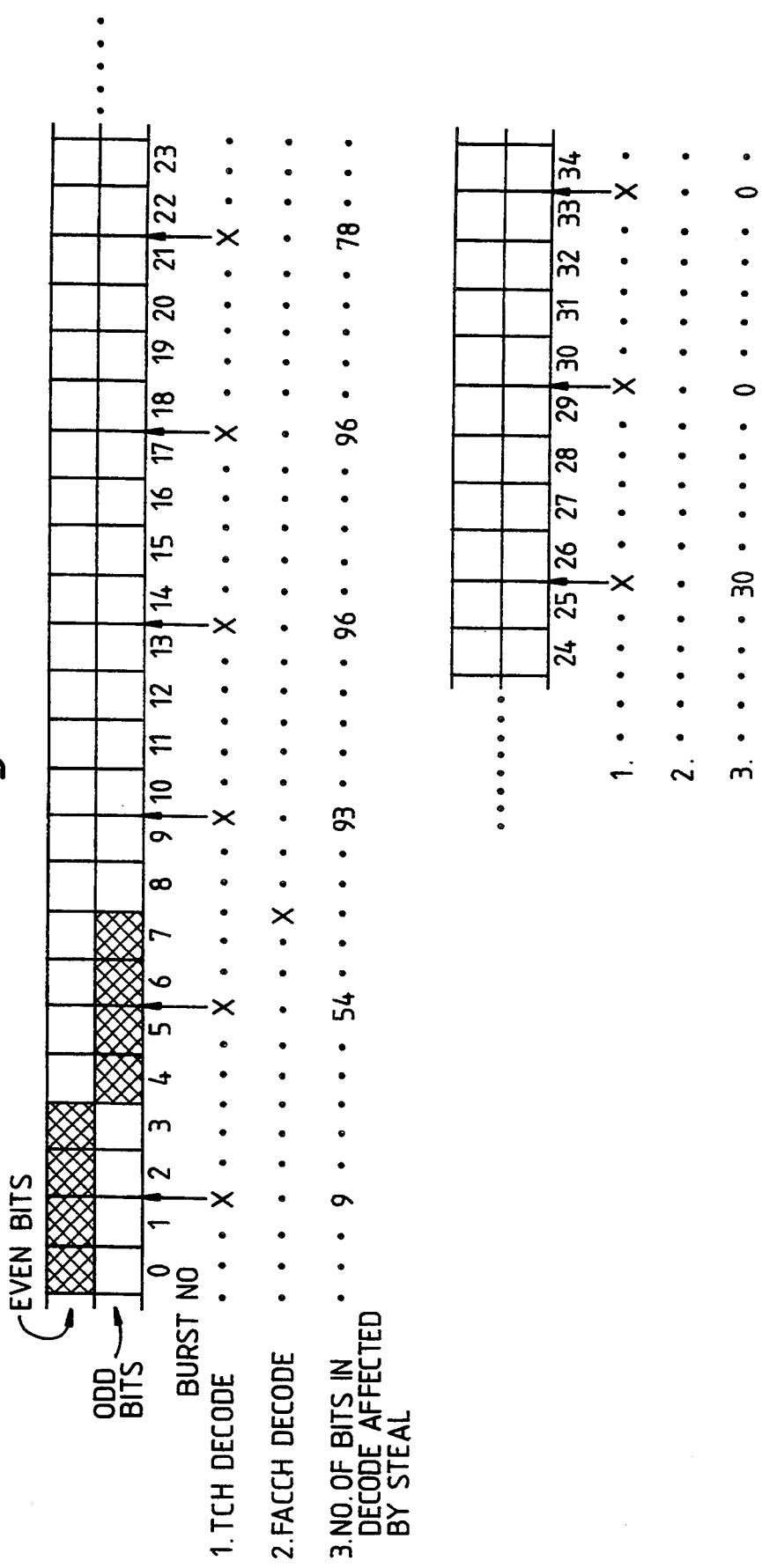

DIGITAL RADIO RECEIVER WITH DECODING OF CONFIDENCE LEVEL INFORMATION SUBSTITUTED FOR INTERLEAVED DATA

This invention relates to a method and apparatus for receiving data encoded to permit forward error correction particularly, but not exclusively, convolutionally encoded data transmitted in a burst-mode radio communications system.

In the present specification digitized signals are referred to as data.

BACKGROUND OF THE INVENTION

In the pan-European digital cellular radio system known as Groupe Spéciale Mobile (GSM) each of the RF channels is divided into timeslots of approximately 0.577 ms duration. The modulating bit rate for a GSM carrier is 270.838 kbit/s which means that the timeslot corresponds to 156.25 bit durations. During this time period the RF carrier is modulated by a data stream, the extent of which is termed a "burst". In other words, a burst represents the physical content of a timeslot. The timeslots are grouped together in sets of eight consecutive timeslots as one TDMA frame. (TDMA is an acronym for time division multiple access). A physical channel is defined by specifying both a RF channel (or, in the case of frequency hopping, a sequence of RF channels) and a TDMA frame timeslot number. Hence for a given RF channel the system has available to it eight physical channels.

There are two main types of logical channel within the GSM system known respectively as traffic channels (TCHs) and control channels (CCHs). The traffic channels are intended primarily to carry encoded speech or user data, whereas the control channels carry signalling and synchronization data between the base station and the mobile station.

One of the control channels, namely the so-called Fast Associated Control Channel (FACCH), is transmitted using capacity from a traffic channel. In this case, a number of bits from each burst of traffic data are "stolen" for use by the FACCH. In a normal traffic burst B there are two single bit flags which indicate respectively whether all the even bits or all the odd bits of the burst B have been stolen for a FACCH block.

It is also a feature of the GSM system that the encoded speech and user data is re-ordered and interleaved over a number of TDMA frames. In fact both speech and FACCH data are interleaved in the same way over 8 TDMA frames. Thus when a FACCH decode instruction occurs the FACCH data is extracted from the odd bits of the four most recently received bursts and the even bits of the immediately preceding four bursts. Because of the alignment between the FACCH and speech data interleaving (i.e. both are eight deep) the whole of a speech block is essentially lost to FACCH data when FACCH steal occurs. However, user data channels may be interleaved over twenty-two bursts. A block of 456 bits is split into 4 sets of 114 bits. Each of these sets is interleaved nineteen-deep, but the start of each is offset from the previous one by one burst, making the span over which the whole block is interleaved to be twenty-two bursts. By contrast with the situation in the case of speech data, the longer interleave length means that FACCH does not overwrite a whole block of user data, but instead partially overwrites a series of bursts from a sequence of user data blocks. By contrast with speech data, therefore, the whole of the user data block is not lost when FACCH steal occurs, but on the contrary the user data may be recovered using error correcting techniques as discussed below.

The GSM system uses a forward error correction code. Forward error correction codes are codes which permit correction of errors by the receive station without the need for retransmission. The basic requirement of a forward error correction code is that sufficient redundancy is included in the transmitted data for error correction to be accomplished at the receiver without further input from the transmitter. In the GSM system data is convolutionally encoded before it is transmitted. A maximum likelihood detector such as a Viterbi detector is generally used to decode the received convolutionally encoded data. This decoding process relies on the fact that the information content of each data symbol being decoded is distributed over a plurality of data elements (bits). The receiver includes means for estimating the certainty (or confidence level) of the value of each bit received. These confidence measures can be used to determine the most likely sequence of symbols transmitted, and hence the decoding process is robust to a proportion of erroneous received bits. (It is noted here that there is no coding or redundancy associated with the single bit steal flags).

In the case of user data, when FACCH steal has occurred the FACCH data bits will be interpreted as traffic data at the traffic decode stage. The FACCH data bits will convey an erroneous confidence weighting as far as the traffic data is concerned and consequently the bit error rate performance of the decoder will be impaired. At the traffic decode stage it is not straightforward to determine which data bits were stolen and therefore it is not an easy matter to compensate for the incorrect confidence level information contributed by the FACCH data bits.

SUMMARY OF THE INVENTION

According to a first aspect of the present invention there is provided a method of receiving data encoded to permit forward error correction wherein selected elements of a set of original data elements relating to a first message are substituted by data elements relating to a second message, which method includes the steps of extracting from the received data the substitute elements in order to reconstitute the second message, modifying the received data by replacing said substitute data elements with further data elements comprising respective components indicative of the level of confidence associated therewith relative to the original data elements, and decoding the modified data using means responsive to said confidence level components to estimate the most likely set of original data elements.

A method in accordance with the invention has the advantage that when data elements relating to a first message have been 'stolen' by substitute data elements relating to a second message prior to transmission, the substitute data elements can in essence be erased at the receiver by replacing them with further data elements which indicate the relatively low confidence level of the modified data elements relative to the first message. Hence, at the decoding stage, the data elements relating to the second message having been 'erased' will not be interpreted as data elements relating to the first message. On the contrary, because of the confidence weighting associated with the replacement data elements, the error rate degradation caused by the second message stealing data elements from the first message can be minimized, i.e. error rate performance is improved.

It is noted here that the first and second messages may be associated respectively with first and second channel types specifically, for example in GSM, traffic channels (TCHs) and fast associated control channels (FACCHs). As used herein the term message means a set of data elements (e.g. bits) irrespective of the length or information content thereof.

In a particular embodiment the data elements relating to the first and second messages are ordered in a predetermined sequence for transmission. In this case the method also includes the step of re-ordering the data elements for recovering the first and second messages.

Moreover, the data elements relating to the first and second messages may be interleaved over a plurality of transmitted blocks of data. Specifically, the data elements relating to the first and second messages may be interleaved respectively over a different number of transmitted data blocks. In this case the step of re-ordering involves re-ordering the substitute data elements relating to the second message, and subsequently re-ordering the data elements of the modified data prior to the decoding step.

A method in accordance with the present invention has particular application in a burst-mode radio communications system wherein the data elements of the respective first and second messages are interleaved over a plurality of bursts.

To facilitate re-ordering of the data elements the received data is suitably stored in memory means such as a random access memory. In one embodiment the steps of re-ordering the data elements relating to the second message and modifying the received data are performed by alternately reading an individual substitute data element relating to said second message from said memory means, and writing the further data element into the memory location associated with said individual data element. In an alternative embodiment the steps of re-ordering the data elements relating to the second message and modifying the received data are performed by reading a plurality of substitute data elements relating to the second message from the memory means prior to writing a plurality of further data elements into the respective memory locations associated with said substitute data elements.

Preferably, for optimal error rate performance, the further data elements comprise respective components indicative of a relatively low, or substantially zero, level of confidence associated therewith relative to the original data elements.

According to a further aspect of the present invention there is provided a receiver for receiving data encoded to permit forward error correction wherein selected elements of a set of original data elements relating to a first message are substituted by data elements relating to a second message, comprising means for extracting from the received data the substitute elements in order to reconstitute the second message, means for modifying the received data by replacing said substitute data elements with further data elements comprising respective components indicative of the level of confidence associated therewith relative to the original data elements, and means for decoding the modified data including means responsive to said confidence level components to estimate the most likely set of original data elements.

BRIEF DESCRIPTION OF THE DRAWINGS

An embodiment of the invention will now be described, by way of example, with reference to the accompanying drawings in which FIG. 3 is a diagram illustrating the effect of FACCH steal on a differently interleaved TCH.

DETAILED DESCRIPTION OF THE INVENTION

The present receiver is intended for receiving interleaved convolutionally encoded data transmitted in a burst-mode radio communication such as GSM. The function of the parts of the receive processing which will now be described is to accept physical channels from an equalizer, to de-interleave, and then to perform a convolutional decode.

Figure 1:
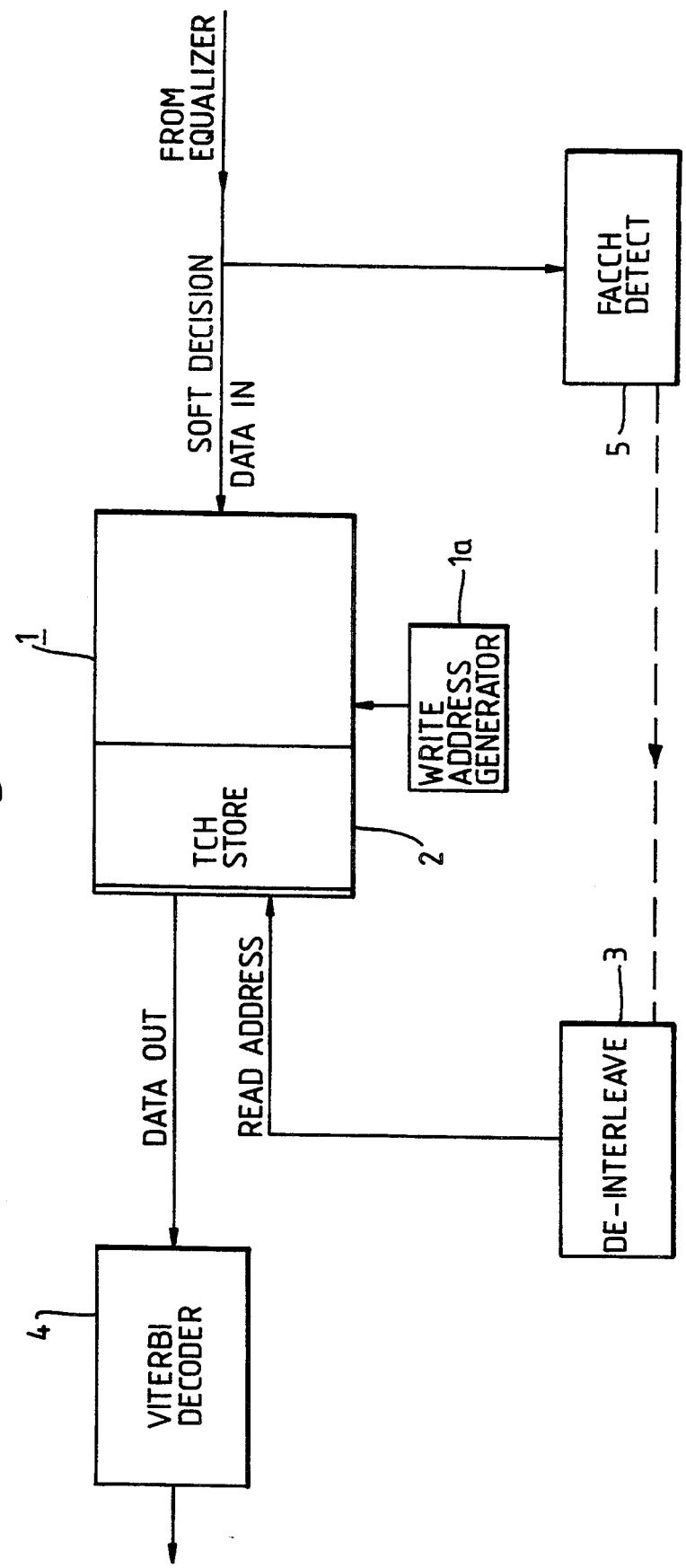
FIG. 1 is a schematic datapath block diagram of the de-interleaving and decoding stages of a receiver in accordance with the present invention.

Referring to FIG. 1, bursts of data from the equalizer are input to a de-interleave store 1 comprising a random access memory (RAM). The de-interleave RAM 1 comprises a segment 2 for storing data from traffic channels (TCHs) and may also comprise further segments (not shown) for storing respectively data from control channels (CCHs) and synchronization channels (SCHs).

The input from the equalizer to the de-interleave process is a set of bursts, each containing 114 bits. More strictly, each burst contains 114 'soft decisions' i.e. a weighted value indicative of the confidence level that the received data symbol is correctly represented. In other words the estimated data symbols may be quantized at more levels than there are symbols in the set of data symbols comprising the so-called alphabet. The number of quantization levels is a matter of design choice depending on the precision required.

The part of the data stream from the equalizer relating to TCH traffic bursts is stored in the TCH store 2 with the aid of write address generator 1a as will now be described with reference to FIG. 2. The RAM used for the TCH store is suitably arranged in 128-word pages of which only 114 will be used for storing TCH data. The data input from the equalizer is essentially stacked sequentially into the TCH store 2. Thus the 114 soft decisions of a first burst a are stored at page 0 in the same order in which they are received. Hence the soft decision stored at position labelled "Bit No. 0" in FIG. 2 will be the first bit (soft decision) of burst a. The soft decision stored at position labelled "Bit No. 1" in FIG. 2 will be the second bit of burst a, and so on until the soft decision stored at position labelled "Bit No. 113" in FIG. 2 will be the last bit of burst a. When all the bits of the first burst a are stored in the first page of the TCCH store 2, subsequent burst b,c,d are stored sequentially in the immediately following pages of the memory. It is noted here that the word length is determined by the particular precision of the soft decisions used. For example the word length will be 8 bits if 8 bit soft decisions are being used. In the case of user data channels interleaved over 22 bursts a full 22 bursts have to be read into the TCH store before a first meaningful traffic decode can occur. After the first meaningful traffic decode the next four bursts are read into burst positions (page Nos.) 0,1,2 and 3 of the TCH store 2. The data previously held in these positions will have served its useful purpose during the previous TCH decode. After storing those next four bursts the next TCH decode occurs. The receive process continues by putting four bursts sequentially into contiguous positions "freed" at the previous decode stage. In the steady state, therefore, TCH decodes occur every 4 frames. In view of the 22 page length of the TCH store 2 it will be evident that this mapping repeats itself every 44 bursts (since 22 is not divisible by 4).

Figure 2:
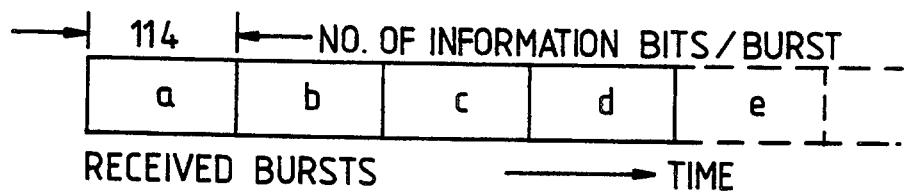
FIG. 2 is a schematic diagram showing in more detail the organization of the RAM (random access memory) in the de-interleaving stage of the receiver in FIG. 1.
Figure 2:
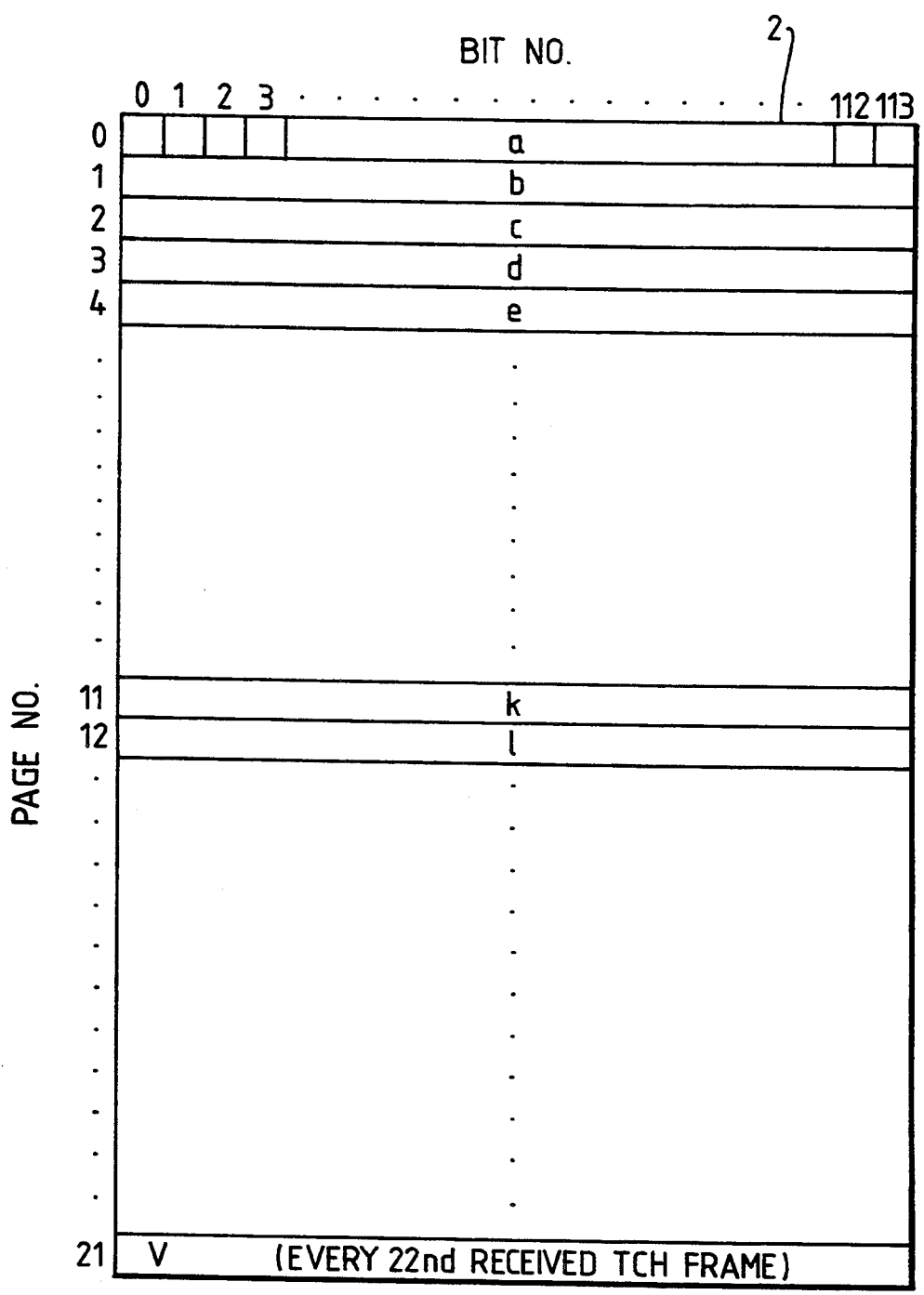

The TCH decodes referred to above are implemented by means of a de-interleave process functionally represented at block 3 in FIG. 2, which can be regarded as an address generator driven by a predetermined de-interleave algorithm. The de-interleave process outputs blocks of data corresponding to the originally transmitted blocks. The de-interleaving process can be regarded as a mapping of data bits. The input to the process is a set of bursts, each containing 114 bits. The output of the process is a set of TCH data blocks each comprising 456 bits. Hence the order in which the stored bits are read out of the TCH store is determined by the de-interleave algorithm.

The output data blocks are then input to a Viterbi decoder 4 which decodes the convolutionally encoded data output from the de-interleaving process. If any errors are present the Viterbi decoder attempts to correct them using a maximum likelihood sequence estimation algorithm. Our co-pending British patent application No. 9015854.4, the contents of which are hereby incorporated by reference, describes a Viterbi decoder in more detail.

As mentioned previously the Fast Associated Control Channels (FACCH), which carry signalling data (e.g. for sending handover messages), obtain access to the physical resource by 'stealing' from the traffic channel with which it has been assigned. For a normal traffic burst there are two single bit flags which indicate whether the traffic data has been stolen for a FACCH block. These two flags indicate respectively whether all the even bits or all the odd bits of that burst have been stolen.

A FACCH detector 5 monitors the steal flags in the bursts received from the equalizer. If a FACCH is detected a FACCH decode will be initiated.

As noted above the FACCH channels are interleaved over 8 bursts. This means that a FACCH decode can occur after 8 bursts have been read into the TCH store 2. The position of the eight bursts containing FACCH data within the RAM 2 is variable depending on when FACCH steal actually occurs. The function of the de-interleaver 3 during the FACCH decode is to restore the original FACCH data blocks by generating the appropriate addresses in the correct sequence so that the data read out of the TCH store 2 corresponds to the FACCH data blocks, and taking into account the fact that the FACCH decode is required from 22-deep interleaved TCH data sometimes referred to as TCH (22).

In accordance with the present invention the FACCH de-interleave process is modified so that a soft-decision '0' is written into the TCH store memory locations previously occupied by the constituent bits of the FACCH block. A zero-valued soft decision indicates that there is no confidence (i.e. maximum uncertainty) as to whether the received data symbol (bit) was a '1' or a '0'. The returning of soft decision zeros at the FACCH decode stage may be implemented in two ways, as follows. In the first case, each time a bit is read out of the TCH store 2 during FACCH decode the read address generated by the de-interleaver is used to write-back a zero-valued soft decision to the same location. Alternatively, because in practice data will be read out of the TCH store 2 very rapidly, rather than perform alternate read/write-back, it may be preferable to run the de-interleave address generation circuitry twice, reading out the stored values on the first phase and writing in the zeros on the second phase.

In GSM it is arranged that FACCH decodes are offset by two bursts from TCH decodes. A FACCH contributes a varying number of bits to subsequent TCH (22) decodes due to the staggering of decode points, and the different interleave structures. After a FACCH starts, it can be shown that it contributes {9,54,93,96,96,78,30} bits respectively to subsequent TCH (22) decodes, as shown in FIG. 3.

After FACCH steal has begun the FACCH decode occurs between the second and third TCH (22) decodes (because it is necessary to look back at the steal flags over the previous eight bursts to have sufficient information to know that a FACCH decode is required). Therefore the substitution for FACCH data with zero-value soft decisions can be effected only for the third and subsequent TCH (22) decodes, as can be seen from FIG. 3. The result of this is that 63 out of 456 FACCH bits cannot be erased. Hence the scheme is 86% effective.

The advantage of replacing the FACCH data with a zero-valued soft decision after the FACCH decode has occurred is that the zero-valued soft decision will then be incorporated into the TCH data block at the subsequent convolutional decode stage. The zero-valued soft decision indicates that there is no confidence that the transmitted bit (i.e. the original TCH bit which was stolen) was a '1' or a '0'. The Viterbi decoder 4 will therefore have an improved chance of correcting the "error" caused by the steal and hence has a better chance of recovering therefrom. Accordingly the FACCH data will not be subject to an attempted decode as traffic data. It will be appreciated that the FACCH data would essentially represent an erroneous confidence level as regards a transmitted TCH bit, and if decoded as traffic data will inevitably degrade the bit error rate performance of the Viterbi decoder.

It is noted here that the only time when the data bits can simply be determined as stolen by a FACCH is when the FACCH decode actually occurs. By the time the next traffic decode occurs, because of the complex interrelationship between the different interleaving schemes, it will not be straightforward to determine which data bits were stolen. This is why the present method replaces the FACCH data bits with zero-valued soft-decisions as part of the FACCH decode process.

In view of the foregoing description it will be evident to a person skilled in the art that various modifications may be made within the scope of the present invention. For example rather than replacing the FACCH data with zero-valued soft decisions, the bit error rate performance of the Viterbi decoder will also be improved if the FACCH data is replaced with low-valued soft decisions which the Viterbi decoder will recognize as indicating only a low level of confidence that the transmitted bit was a '1' or a '0'. Furthermore it is noted here that the present invention is not restricted to burst-mode radio communications systems. Moreover, the transmitted data may be encoded using a forward error correction code other than convolutional code.

I claim:

1. A method of receiving data encoded to permit forward error correction wherein selected elements of a set of original data elements relating to a first message are substituted by data elements relating to a second message, which method includes the steps of:
   extracting from the received data the substitute elements in order to reconstitute the second message,
   modifying the received data by replacing said substitute data elements with further data elements comprising respective components indicative of the level of confidence associated therewith relative to the original data elements, and
   decoding the modified data using means responsive to said confidence level components to estimate the most likely set of original data elements.

2. A method of receiving data as claimed in claim 1, wherein the data elements relating to the first and second messages are interleaved over a plurality of transmitted blocks of data.

3. A method of receiving data as claimed in claim 2, wherein the data elements relating to the first and second messages are respectively interleaved over a different number of transmitted data blocks, wherein the step of re-ordering involves re-ordering the substitute data elements relating to the second message and subsequently re-ordering the data elements of the modified data prior to the decoding step.

4. A method of receiving data as claimed in claim 1, wherein the further data elements comprise respective components indicative of a relatively low level of confidence associated therewith relative to the original data elements.

5. A method of receiving data as claimed in claim 4, wherein the further data elements comprise respective components indicative of substantially zero level of confidence associated therewith relative to the original data elements.

6. A method of receiving data as claimed in claim 1, wherein the data elements relating to the first and second messages are ordered in a predetermined sequence for transmission, the method including the step of re-ordering the data elements for recovering said first and second messages.

7. A method of receiving data as claimed in claim 6, means.

8. A method of receiving data as claimed in claim 7, wherein the steps of re-ordering the data elements relating to the second message and modifying the received data are performed by alternately reading an individual substitute data element relating to said second message from said memory, and writing the further data element into the memory location associated with said individual data element.

9. A method of receiving data as claimed in claim 7, wherein the steps of re-ordering the data elements relating to the second message and modifying the received data are performed by reading a plurality of substitute data elements relating to the second message from said memory prior to writing a plurality of further data elements into the respective memory locations associated with said substitute data elements.

10. A receiver for receiving data encoded to permit forward error correction wherein selected elements of a set of original data elements relating to a first message are substituted by data elements relating to a second message, the receiver comprising:
    means for extracting from the received data the substitute elements in order to reconstitute the second message,
    means for modifying the received data by replacing said substitute data elements with further data elements comprising respective components indicative of the level of confidence associated therewith relative to the original data elements, and
    means for decoding the modified data including means responsive to said confidence level components to estimate the most likely set of original data elements.

11. A receiver for receiving data as claimed in claim 10, wherein the data elements relating to the first and second messages are interleaved over a plurality of transmitted blocks of data.

12. A receiver for receiving data as claimed in claim 11, wherein the data elements relating to the first and second messages are respectively interleaved over a different number of transmitted data blocks, wherein the means for re-ordering are adapted to re-order the substitute data elements relating to the second message and subsequently to re-order the data elements of the modified data prior to the decoding step.

13. A receiver for receiving data as claimed in claim 10, wherein the further data elements comprise respective components indicative of a relatively low level of confidence associated therewith relative to the original data elements.

14. A receiver for receiving data as claimed in claim 13, wherein the further data elements comprise respective components indicative of substantially zero level of confidence associated therewith relative to the original data elements.

15. A receiver for receiving data as claimed in claim 10, wherein the data elements relating to the first and second messages are ordered in a predetermined sequence for transmission, and further including means for re-ordering the data elements for recovering said first and second messages.

16. A receiver for receiving data as claimed in claim 15, including memory means for storing the received data.

17. A receiver for receiving data as claimed in claim 16, wherein the means for re-ordering the data elements relating to the second message and the means for modifying the received data are adapted to alternately read an individual substitute data element relating to said second message from said memory means, and write the further data element into the memory location associated with said individual data element.

18. A receiver for receiving data as claimed in claim 16, wherein the means for re-ordering the data elements relating to the second message and the means for modifying the received data are adapted to read a plurality of substitute data elements relating to the second message from said memory means and subsequently to write a plurality of further data elements into the respective memory locations associated with said substitute data elements.

* * * * *

UNITED STATES PATENT AND TRADEMARK OFFICE
CERTIFICATE OF CORRECTION

PATENT NO. : 5,384,782
DATED : January 24, 1995
INVENTOR(S) : Andrew Elms

It is certified that error appears in the above-indentified patent and that said Letters Patent is hereby corrected as shown below:

Title page, item [73], Assignee: should read-- Nokia Mobile Phones (UK) Limited--.

Signed and Sealed this

Eighteenth Day of April, 1995

Attest:

BRUCE LEHMAN

*Commissioner of Patents and Trademarks*

*Attesting Officer*